United States Patent

[11] 3,579,813

[72] Inventor Hiroshi Tomiwa
Osaka, Japan

[21] Appl. No. 884,257
[22] Filed Dec. 11, 1969
[45] Patented May 25, 1971
[73] Assignee Matsuo Electric Company, Limited
Toyonaka-shi, Osaka-fu, Japan
[32] Priority Dec. 23, 1968
[33] Japan
[31] 43/94395

[54] METHOD OF MAKING ELECTRONIC COMPONENTS ON COMBLIKE METAL FINGERS AND SEVERING THE FINGERS
3 Claims, 19 Drawing Figs.

[52] U.S. Cl. ........ 29/570, 29/25.41, 317/230
[51] Int. Cl. ........ H01g 13/00
[50] Field of Search ........ 317/230, 231, 232, 233; 29/569, 570, 576, 625, 626

[56] References Cited

UNITED STATES PATENTS

| | | | |
|---|---|---|---|
| 3,375,413 | 3/1968 | Brill | 317/230 |
| 3,412,444 | 11/1968 | Klein | 29/25.41 |
| 3,424,952 | 1/1969 | Vierow | 317/230 |
| 3,465,426 | 9/1969 | Baier et al. | 29/570 |
| 3,469,294 | 9/1969 | Hayaski et al. | 29/25.42 |

*Primary Examiner*—James D. Kallam
*Attorney*—Eugene E. Geoffrey, Jr.

ABSTRACT: A method of making a chip-shaped electronic component by etching a metal plate to form a plurality of raised terminals, forming a comblike metal plate having electronic elements formed on the outer ends of the projections and then electrically and mechanically securing the electronic elements to the terminals and then separating the individual chip-shaped components to form a resultant structure having downwardly extending terminals which may be readily soldered or otherwise attached to a printed circuit board or other electronic circuit structure.

INVENTOR.
HIROSHI TOMIWA
BY [signature]
ATTORNEY

PATENTED MAY 25 1971 3,579,813

SHEET 2 OF 3

INVENTOR.

HIROSHI TOMIWA

BY

ATTORNEY

INVENTOR.

HIROSHI TOMIWA

BY

ATTORNEY

METHOD OF MAKING ELECTRONIC COMPONENTS ON COMBLIKE METAL FINGERS AND SEVERING THE FINGERS

This invention relates to chip-shaped passive electronic components such as capacitors and the like and more particularly to novel and improved components that may be readily bonded to electrical conductors. The invention also relates to a novel and improved method for manufacturing chip-shaped electronic components.

With the development of miniaturized electronic devices the electronic components must of course be as small as possible. In the known prior art, components such as capacitors and other devices are provided with external conductors and difficulties are entailed in connecting such devices particularly to hybrid printed circuit boards. Accordingly, this has resulted in one of the serious disadvantages in the manufacture of hybrid circuits and has caused difficulties in mass production because of manual problems as well as jig requirements. Furthermore, the cost of such components has been relatively high.

One object of this invention resides in the provision of a novel and improved method for manufacturing electronic components wherein a substantial number of components can be assembled continuously or concurrently and a number of components can be encapsulated at the same time with the result that a high degree of uniformity and quality is obtained at relatively low cost.

Another object of the invention resides in the provision of a novel and improved method of manufacturing electronic components wherein two or more terminals will be disposed in a single plane, and the encapsulating process can be carried out at relatively high speeds.

A further object of the invention resides in the provision of a novel and improved electronic components adapted for face bonding process and it does not require external leads whereupon the installation of the component on a printed circuit board can be effected at materially reduced cost.

In accordance with the invention the improved electronic component is formed by etching one face of a metal plate to form a plurality of sets of terminals on one face and which are interconnected by a very thin portion of the original plate. A comblike structure is formed having an elongated metallic member and a plurality of terminal projections extending in spaced relationship therefrom. The spacing between the terminal projections is coordinated with the spacing between the terminals formed on the metal plate so that they will be accurately aligned. The electronic component is electrically connected and secured to the terminal projections and to certain of the terminals formed on the metal plate. The elongated metallic member is then removed and the resulting assembly is at least partially enclosed within a synthetic resin. The individual components are then separated by etching the portions of the metal plate joining the terminals and then cutting the synthetic resin.

More specifically, the comblike structure is preferably prepared by a stamping process and the elongated metallic member holds the terminal projections in precise alignment with the terminals formed on the metal plate. The electronic components are secured to the ends of the terminal projections and to terminals on the metal plate. In addition, portions of the terminal projections spaced from the ends thereof are secured to separate sets of terminals on the metal plate. In this way, mass production is greatly facilitated and the process can be carried on continuously.

The terminals are formed on the thin metal plate preferably by the use of a suitable mask on one side thereof so that the plate can be etched to materially reduce its thickness and leave a portion thereof as a support for the unetched portions of the plate which ultimately form the terminals which are arranged in sets of two or more.

The comblike structure having the electronic components secured in position as described above is then accurately aligned with corresponding sets of terminals on the plate and the electronic elements are bonded to both the terminal projections and the corresponding terminals on the metal plate by soldering or welding. The unnecessary portions of the comblike structure are then removed and the metal plate and electronic elements are enclosed by a synthetic resin. Thereafter the individual components are separated as described above. The exposed faces of the terminals are then preferably plated with gold, silver, solder or the like to facilitate bonding of the device to a printed circuit board or other electrical conductors.

The above and other objects and advantages of the invention will become more apparent from the following description and accompanying drawings in accordance with the invention.

Figure 1:
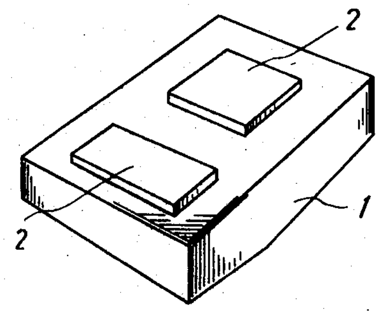
FIG. 1 is a greatly enlarged bottom perspective view of a tantalum electrolytic capacitor in accordance with the invention.
Figure 3:
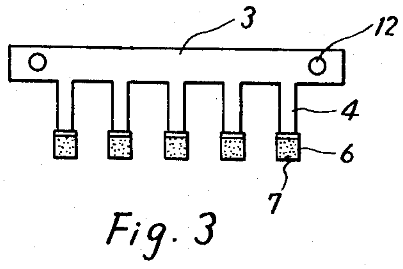
FIG. 3 is a plane view of the comblike structure of FIG. 2 with electronic components formed on the outer ends of the terminal projections.
Figure 4A:
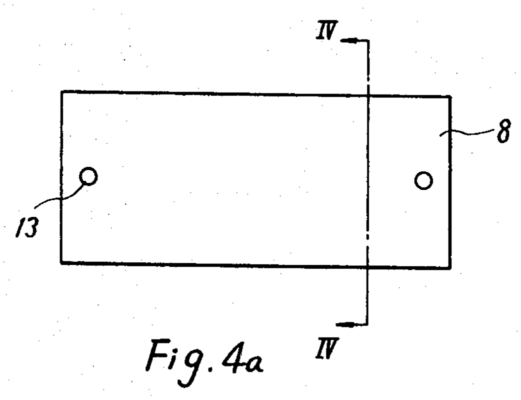
Figure 4B:
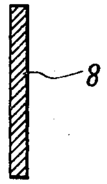
Figure 5A:
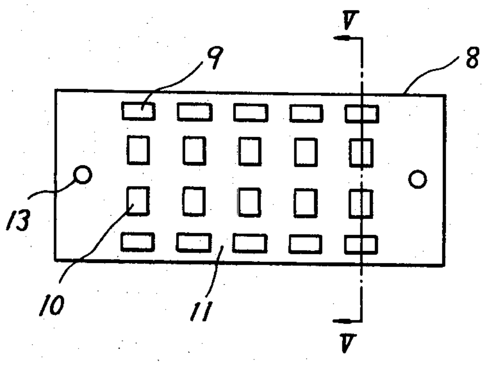
Figure 5B:
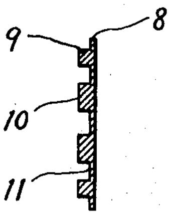
Figure 6A:
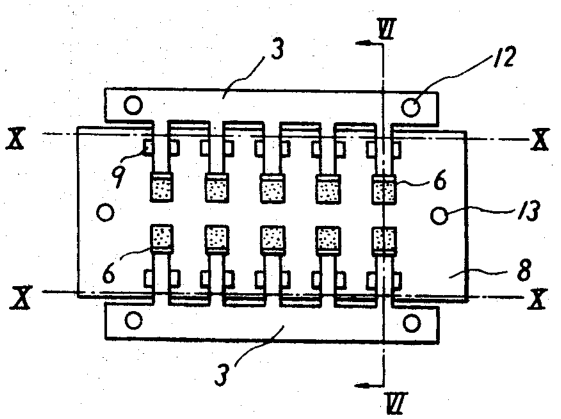
Figure 6B:
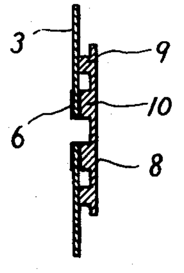
Figure 7A:
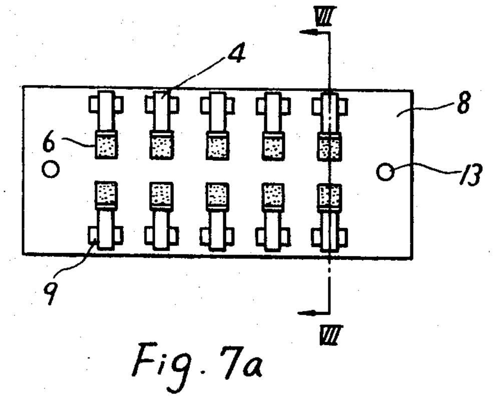
Figure 7B:
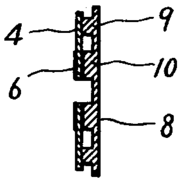
Figure 8A:
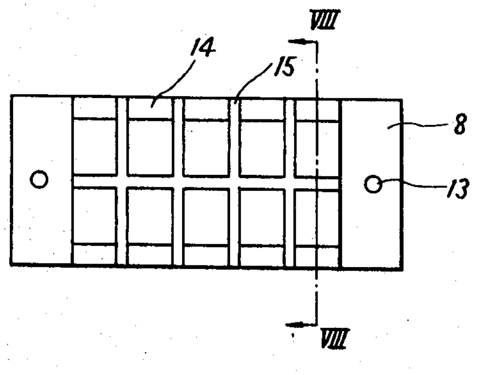
Figure 8B:
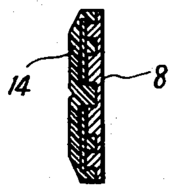
Figure 9A:
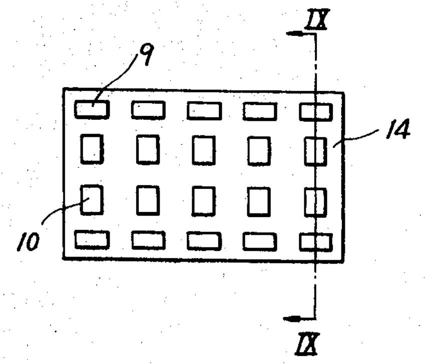
Figure 9B:
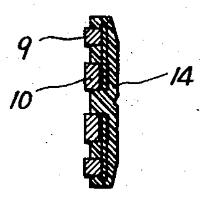
Figure 10:
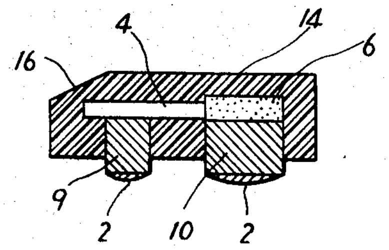
Figure 11:
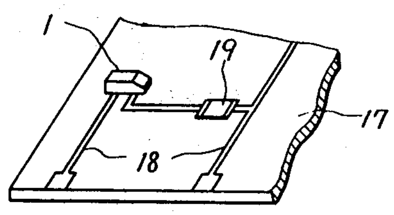
Figure 12:
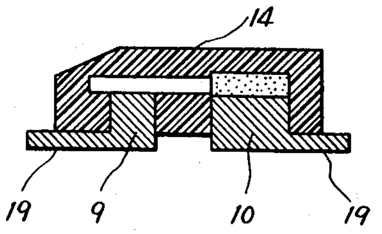
Figure 13:
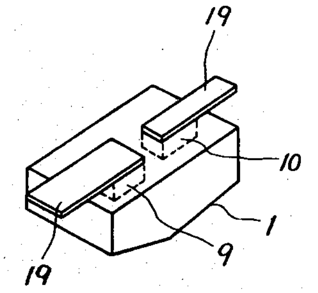

FIG. 4*a* is a plan view of a thin metal plate for forming another set of terminals;

FIG. 4*b* is a cross-sectional view taken along the line IV–IV of FIG. 4*a*;

FIG. 5*a* is a plan view of the etched plate of FIG. 4*a* showing sets of terminals formed on one side thereof;

FIG. 5*b* is a cross-sectional view of FIG. 5*a* taken along the line V–V thereof;

FIG. 6*a* is a plan view of the etched metal plate of FIG. 5*a* with two comblike structures as shown in FIG. 3 in position thereon;

FIG. 6*b* is a cross-sectional view of FIG. 6*a* taken along the line VI–VI thereof;

FIG. 7*a* is a plan view of the assembly of FIG. 6*a* with the elongated members of the comblike structure removed by severing the terminal projections along the lines X–X of FIG. 6*a*;

FIG. 7*b* is a cross-sectional view of FIG. 7*a* taken along the line VII–VII thereof;

FIG. 8*a* is a plan view of the structure shown in FIG. 7*a* encapsulated in a synthetic resin;

FIG. 8*b* is a cross-sectional view of FIG. 8*a* taken along the line VIII–VIII thereof;

FIG. 9*a* is a bottom view of the structure shown in FIG. 8*a* and with the portions of the metal plate between the terminals being removed;

FIG. 9*b* is a cross-sectional view of FIG. 9*a* taken along the line IX–IX thereof;

FIG. 10 is a cross-sectional view of the completed capacitor as shown in FIG. 1;

FIG. 11 is a perspective view of a hybrid printed circuit board with the capacitor as shown in FIGS. 1 and 10 secured thereto;

FIG. 12 is a cross-sectional view of a modified embodiment of the invention; and FIG. 13 is a bottom perspective view of the structure shown in FIG. 12.

In the drawings like numerals are utilized to denote corresponding elements in the FIGS. and the drawings have been greatly enlarged to facilitate illustration of the structural details.

Referring now to FIG. 1, the numeral 1 denotes a tantalum electrolytic capacitor having two terminals 2,2 formed in accordance with the invention. While the invention will be described in connection with the manufacture of an electrolytic capacitor, it is to be understood that the invention is equally useful for the manufacture of other types of electronic components.

Figure 2:
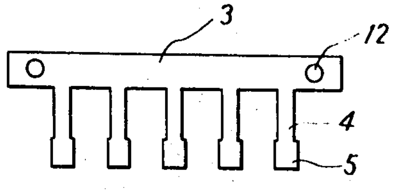
FIG. 2 is a plan view of a comblike structure used in the manufacture of the capacitor shown in FIG. 1.

In the formation of an electronic component in accordance with the invention a comblike structure shown in FIG. 2 is formed having an elongated member 3 and a plurality of spaced terminal projections 4 extending therefrom which carry electronic components on the outer ends 5 of the projections 4. The comblike structure is formed by stamping a sheet of metal such as tantalum, miobium, titanium or aluminum. While only five terminal projections 4 have been illustrated, in normal manufacturing process the comblike structure may include 30 or more terminal projections 4. The elongated member 3 is provided with two holes 14 which serve as a guide for accurately positioning the structure with respect to the terminals formed on the metal plate as shown in FIG. 5*a*.

In utilizing the invention to form a tantalum capacitor, an anode body consisting of sintered tantalum powder is bonded by welding a body to each of the outer ends of the terminal projections 4. An anodic oxidation layer, a manganese layer and a carbon and silver cathode layer are successively formed, and this capacitor is denoted by the numeral 6 in FIG. 3. While tantalum powder is used as the anode body in the instant embodiment of the invention, powder of other film-forming materials such as aluminum and niobium may also be used or wires or sheets of such materials which are suitably worked may also be employed. The numeral 7 in FIG. 3 denotes a terminal portion of the element 6.

Referring now to FIGS. 4*a* and 4*b*, the metal plate 8 may be formed of a suitable material such as nickel, Kovar (trade name), iron or copper which can be welded or soldered and which has a suitable thickness for the formation of the terminals. A pair of holes 13 serve as guides for accurately positioning the plate with the comblike structure through the utilization of a suitable jig.

The metal plate 8 is then further etched by conventional maskings and commercial etching techniques to form a plurality of sets of terminals or islands 9 and 10 as shown in FIGS. 5*a* and 5*b*. The terminals 9 and 10 have areas suitable for assembling the capacitor elements as described in connection with FIG. 3 and the terminals 9 and 10 are spaced so that the individual capacitors can be separated after the resin molding process. As pointed out above, the terminals 9 and 10 are held in position by thin interconnecting portions 11 of the metal plate 8. One or both of the terminals 9 and 10 of each set are preferably plated with gold, silver, solder or the like to facilitate bonding of the capacitor element.

Referring now to FIGS. 6*a* and 6*b*, the comblike structures provided with the capacitor elements 6 as shown in FIG. 3 are placed on the terminal array as shown in FIGS. 5*a* and 5*b*. For bonding purposes a paste solder may be applied to one terminal 10 on each set which will serve as the cathode terminal of the capacitor, and the capacitor element is then accurately positioned thereon. If the terminal 10 is previously plated with solder, the use of a paste solder can be omitted. The other terminal 9 of each set is aligned with a portion of the terminal projection 4 and is suitably bonded or welded thereto. Since the terminal projections 4 are supported by the elongated member 3, the capacitor elements 6 will be precisely aligned with the terminals formed on the plate 8 by utilizing the guide holes 12 and 13 in connection with a suitable jig.

After completion of the bonding process, the elongated member 3 and portions of the terminal projections 4 are removed by cutting along the lines X–X of FIG. 6*a* which then results in the structure as shown in FIGS. 7*a* and 7*b*. The terminal portions 7 of the capacitor element 6 may be soldered to the terminals 10 by heating with infrared radiation or by placing the structure in an oven. If necessary, the completed assembly may thereafter be washed to remove flux.

The assembly including the capacitor element 6 is then placed in a metal mold for molding a resin on the side of the plate 8 carrying the elements 6. The molded synthetic resin is denoted by the numeral 14 and the resultant structure is shown in FIGS. 8*a* and 8*b*.

After completion of the molding process, an etching mask having the same pattern which was used in forming the terminal array on one side of the metal plate 8 is then applied to the opposing side of the metal plate 8. The opposing side of the metal plate 8 is then etched to completely separate all terminals 9 and 10. The terminals thus formed project from the bottom face of the resin block a distance corresponding to the thickness of the unetched portion 11 between the terminals 9 and 10. This insures superior contact between the terminals and printed conductors or a printed circuit board when the capacitor is attached to the circuit board since only the surface of the terminals contact the printed conductors. Moreover, this feature permits the formation of crossover coupling so that the capacitor can bridge other printed conductors. If the thickness of the metal plate 8 and the etching depth thereof are properly selected, a substantial part of the thickness is embedded in the synthetic resin 14 so that the terminals are firmly held in position.

After the exposed terminal surfaces have been plated, the resin-molded block is then cut along horizontal and vertical lines 15 as shown in FIG. 8*a* to separate the individual chip-shaped capacitors as shown in FIGS. 1 and 10. In FIG. 10 the terminals 9 and 10 are provided with soldered surfaces 2 and a portion of the molded resin is cut away as denoted by the numeral 16 to indicate the anode side of the capacitor.

FIG. 11 illustrated the attachment of a capacitor 1 in accordance with the invention to a hybrid printed circuit board 17 having printed conductors 18 and a resistor 19.

FIGS. 12 and 13 illustrate a modified embodiment of the invention. This embodiment is substantially identical to that described above except that the terminals 9 and 10 have longitudinally extending portions 19 formed integrally with the terminals, the latter being indicated as dotted lines in FIG. 13. The extending portions 19 facilitate the attachment of the capacitor 1 to conductors on a printed circuit board in certain instances wherein the conductors may be widely spaced. The extending portions can be formed by the utilization of an appropriate etching mask which would of course differ from the masks used in the first and second etching steps described above.

It is evident from the foregoing description that a number of chip-shaped passive electronic components in accordance with the invention can be formed at the same time and thus the element-assembling process and the resin-molding process are greatly facilitated. Moreover, when connecting the electronic component in accordance with the invention to conductors on a printed circuit board, a number of components can be simultaneously bonded by the use of a face-bonding technique by placing the terminal pads 2 in contact with corresponding conductors on the board and applying supersonic oscillation or by passing the board through an oven. Thus the bonding process is greatly simplified and manufacturing costs are reduced.

While the foregoing embodiment of the invention has been described in connection with the formation of tantalum capacitors, it is evident that the invention is also applicable to other types of capacitors as well as other electronic components such as inductors. Further, this invention is applicable to more complicated electronic components having three or more terminals by simply increasing the number of terminals included in each set.

I claim:

1. The method of manufacturing resin-molded chip-shaped electronic components comprising the steps of etching one surface of a metal plate through part of its thickness to form an array of a plurality of sets of discrete terminals interconnected by part of the thickness of said plate, forming a comblike metal structure having a plurality of spaced parallel projections extending therefrom, forming an electronic component on each of said spaced parallel projections, positioning said comblike structure on said etched metal plate with said electronic components in alignment with at least one terminal of each set and an adjoining portion of said projection in alignment with another terminal of each set, electrically connecting said electronic components and said adjoining portions of said projections to said terminals severing said projections adjoining said other set of terminals, molding a resin about said terminals and electronic components and then severing the portions of said plate interconnecting said terminals and then severing the resin to separate said sets of terminals to form a plurality of said components with the terminals being disposed on one face thereof.

2. The method of manufacturing resin-molded chip-shaped electronic components according to claim 1 wherein said interconnecting portions of said plate are severed by etching the metal and said terminals project from said one face.

3. The method of manufacturing resin-molded chip-shaped electronic components according to claim 2 wherein the last said etching step removes selected parts of said interconnecting portions whereby said terminals include integral portions extending outwardly therefrom and parallel to the plane of said one face.